United States Patent
Aida

(10) Patent No.: US 6,767,644 B2
(45) Date of Patent: Jul. 27, 2004

(54) METALLIZED POLYIMIDE FILM

(75) Inventor: Masayuki Aida, Aizuwakamatsu (JP)

(73) Assignee: Mitsubishi Shindoh Co., Ltd., Tokyo (JP)

( * ) Notice: Subject to any disclaimer, the term of this patent is extended or adjusted under 35 U.S.C. 154(b) by 88 days.

(21) Appl. No.: 10/240,468

(22) PCT Filed: Apr. 3, 2001

(86) PCT No.: PCT/JP01/02888
§ 371 (c)(1),
(2), (4) Date: Oct. 1, 2002

(87) PCT Pub. No.: WO01/74585
PCT Pub. Date: Oct. 11, 2001

(65) Prior Publication Data
US 2003/0148078 A1 Aug. 7, 2003

(30) Foreign Application Priority Data
Apr. 3, 2000 (JP) ........................................ 2000-101077

(51) Int. Cl.⁷ ............................. B32B 27/00; B05D 3/00
(52) U.S. Cl. .................... 428/473.5; 428/209; 428/333; 428/339; 428/446; 428/469; 428/612; 428/687; 428/543; 427/533; 427/534; 427/535; 427/536; 427/537; 427/569; 427/578; 427/307
(58) Field of Search .............................. 428/473.5, 209, 428/333, 339, 446, 469, 612, 687, 543; 427/533–537, 569, 576, 578, 307

(56) References Cited

U.S. PATENT DOCUMENTS 5,084,355 A  1/1992  Takahashi et al.

FOREIGN PATENT DOCUMENTS

| EP | 0 337 445 | 10/1989 |
|---|---|---|
| JP | 1-133729 | 5/1989 |
| JP | 2-50493 | 2/1990 |
| JP | 3-274261 | 12/1991 |
| JP | 5-183012 | 7/1993 |
| JP | 6-237056 | 8/1994 |
| JP | 7-197239 | 8/1995 |
| JP | 8-330695 | 12/1996 |
| JP | 11-268183 | 10/1999 |

OTHER PUBLICATIONS

International Search Report—PCT/JP01/02888, ISA/JPO, Jun. 20, 2001.

*Primary Examiner*—Deborah Jones
*Assistant Examiner*—Ling Xu
(74) *Attorney, Agent, or Firm*—Harness, Dickey & Pierce, PLC

(57) ABSTRACT

A metallized polyimide film of the present invention comprises a polyimide film 1 which has undergone surface roughening treatment to produce a surface Ra value of 2 to 10 nm, an intermediate layer 2 formed from one, or two or more elements selected from a group consisting of molybdenum, silicon and silicon monoxide, which is formed on top of the surface which has undergone surface roughening treatment with an average thickness of 5 to 50% of the aforementioned Ra value, and a conductive metal layer 4 which is formed on top of the intermediate layer 2. This construction improves the bonding strength between the polyimide film and the metal layer.

3 Claims, 2 Drawing Sheets

METALLIZED POLYIMIDE FILM

TECHNICAL FIELD

The present invention relates to a metallized polyimide film in which a metal layer of a metal such as copper is formed on the surface of a polyimide film, and a production method thereof, and relates particularly to a metallized polyimide film used as a TAB tape, a flexible circuit board, or a flexible wiring board or the like.

BACKGROUND ART

In recent years, the demand for circuit boards using TAB (Tape Automated Bonding) or FPC (Flexible Print Circuit), which offer advantages in the trend towards smaller, lighter weight and structurally more flexible electronic devices, has continued to increase. Conventionally, these types of circuit boards have used a flexible plastic substrate with a layer of copper foil bonded to this substrate using an adhesive such as an epoxy based adhesive.

However, in order to increase the packaging density in electronic devices, it is desirable to reduce the film thickness of this type of circuit board even further, and the structure described above, in which copper foil is bonded to a substrate, is unable to fully satisfy these demands for even thinner films.

Furthermore, in the aforementioned circuit boards using an adhesive, (1) the etching solution for the copper foil may penetrate through to the adhesive layer, and when a bias is then applied under conditions of high temperature and high humidity, copper migration may occur, causing a short circuit within the circuit, (2) in order to improve speed, the impedance must be matched and cross-talk reduced, but the presence of the adhesive makes this difficult, (3) the dimensional stability of the adhesive layer is poor, (4) the presence of the adhesive layer makes ultra fine processing of the circuit board difficult, making a shift to higher densities problematic, (5) the thermal characteristics of the adhesive layer are inferior to those of the plastic substrate material, leading to problems of thermal stability, and making a shift to higher densities problematic, and (6) the presence of the adhesive means that deformation of the product is more likely to occur.

In order to resolve these problems, techniques for forming a metallized film without using an adhesive are being investigated. Known examples include methods in which thin film formation techniques such as vacuum deposition, sputtering or ion plating are used to form a metallic thin film directly onto a plastic substrate in accordance with a circuit pattern, and a metal plating layer is then deposited on top of this metallic thin film using electroplating or the like, and methods in which a metallic thin film is formed on the surface of a plastic substrate, a metal is then deposited on top of this thin film using electroplating or the like, and the metal layer is then etched to form a circuit pattern.

However, in these types of structures, the post processes such as the circuit pattern formation process and the electroplating process cause a reduction in the bonding strength between the plastic substrate and the metallic thin film, increasing the possibility of the metallic thin film separating from the substrate.

In order to resolve this problem, a configuration is disclosed in Japanese Unexamined Patent Application, First Publication No. Hei 1-133729, in which a film of a zirconium oxide or a silicon oxide is formed on the surface of a polyimide film, and a copper layer is then formed thereon.

In Japanese Unexamined Patent Application, First Publication No. Hei 3-274261, a configuration is disclosed in which a film of nickel, chromium, titanium, vanadium, tungsten or molybdenum or the like is formed on the surface of a polyimide film, and a copper layer is then formed thereon.

In Japanese Unexamined Patent Application, First Publication No. Hei 5-183012, a configuration is disclosed in which a thin film of nickel, cobalt, tungsten or molybdenum or the like is formed on the surface of a polyimide film using electroless plating, and a copper layer is then formed thereon using electroplating methods.

In Japanese Unexamined Patent Application, First Publication No. Hei 7-197239, a configuration is disclosed in which a metal such as nickel, chromium, molybdenum or tungsten is deposited on the surface of a polyimide film using vacuum deposition, and a copper layer is then formed thereon using electroplating.

In Japanese Unexamined Patent Application, First Publication No. Hei 8-330695, a configuration is disclosed in which a thin film of molybdenum is formed on the surface of a polyimide film using sputtering, and a copper layer is then formed thereon using electroplating.

However, none of the above methods is able to completely prevent the separation of the copper layer from the polyimide film, and a configuration capable of further strengthening the bonding between the copper layer and the polyimide film has been keenly sought.

The present invention takes the above circumstances into consideration, with an object of providing a metallized polyimide film which is capable of increasing the bonding strength between the metal layer and the polyimide film, as well as a method of producing such a metallized polyimide film.

DISCLOSURE OF INVENTION

In order to achieve the aforementioned object, a metallized polyimide film according to the present invention comprises a polyimide film which has undergone surface roughening treatment to produce a surface Ra value of 2 to 10 nm, an intermediate layer formed from one, or two or more films selected from a group consisting of molybdenum, silicon and silicon monoxide, which is formed on top of the surface which has undergone surface roughening treatment with an average thickness of 5 to 50% of the aforementioned Ra value, and a conductive metal layer which is formed on top of the intermediate layer. The thickness of the conductive layer will vary depending on the material used in the metal layer and the film formation method employed, although it is though that typically the thickness will be at least 300 angstroms, and at least 1000 angstroms as the film becomes more dense.

According to this type of metallized polyimide film, a suitable degree of surface roughening treatment is performed on the surface of the polyimide film, and a film of molybdenum, silicon or silicon monoxide is then formed thereon with a suitable distribution, and consequently the bonding strength of the metal layer can be improved.

A method of producing a metallized polyimide film according to the present invention comprises a step for performing surface roughening treatment on the surface of a polyimide film to produce a surface Ra value of 2 to 10 nm, a step for forming an intermediate layer from one, or two or more films selected from a group consisting of molybdenum, silicon and silicon monoxide, which is formed on top of the polyimide film surface which has undergone surface roughening treatment with an average thickness of 5 to 50% of the aforementioned Ra value, and a step for forming a metal layer of a conductive thickness on top of the intermediate layer.

The surface roughening treatment described above can utilize at least one of alkali etching treatment, vacuum plasma treatment, and atmospheric corona treatment.

A metallized polyimide film of the present invention may also be in the form of a TAB tape, a flexible circuit board, or a flexible wiring board or the like.

BEST MODE FOR CARRYING OUT THE INVENTION

As follows is a description of preferred examples of a metallized polyimide film according to the present invention, with reference to the drawings.

Figure 1:
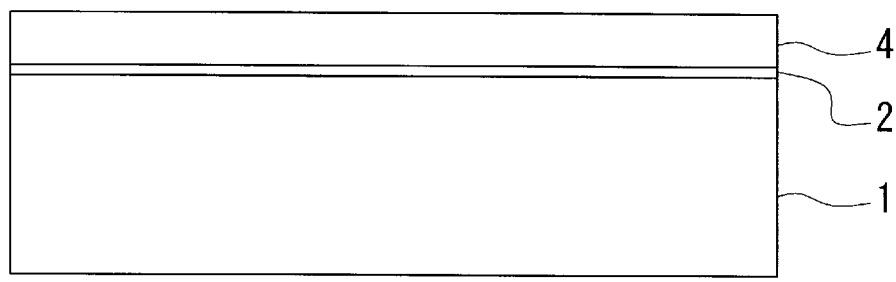
FIG. 1 is a enlarged cross-sectional view of one example of a metallized polyimide film according to the present invention.

FIG. 1 is a schematic illustration showing one example of a metallized polyimide film according to the present invention. The metallized polyimide film comprises a polyimide film 1 which has undergone surface roughening treatment, an intermediate layer 2 formed from one, or two or more elements selected from a group consisting of molybdenum, silicon and silicon monoxide, which is formed on top of the surface which has undergone surface roughening treatment, and a metal layer 4 which is formed on top of the intermediate layer 2. In this example, the intermediate layer 2 and the metal layer 4 are formed on one surface of the polyimide film 1, although the intermediate layer 2 and the metal layer 4 may also be formed on both surfaces of the polyimide film 1, or may be formed so as to generate a certain pattern.

A first characteristic of the present invention is the fact that the surface of the polyimide film 1 onto which the intermediate layer 2 and the metal layer 4 are formed has been subjected to prior surface roughening treatment, so that the value of the center plane average roughness (Ra) of the surface is from 2 to 10 nm. Ra values from 2 to 5 nm are even more preferred. If the Ra value falls within this range, then the bonding strength between the metal layer 4 and the polyimide film 1 can be increased. If the Ra value is too large, then the surface of the polyimide film 1 deteriorates, and the bonding strength of the metal layer 4 decreases. In contrast, if the Ra value is too small, then the fragile (brittle) layer can not be adequately removed, and the bonding strength of the metal layer 4 decreases.

The center plane average roughness (Ra) represents the value determined by the formula shown below, wherein a roughness curve is produced by eliminating low frequency components from a cross-sectional curve, the measured surface area S portion is then extracted in the direction of the center plane of this roughness curve, and the center plane of this extracted portion is deemed the x axis, the direction of the depth magnification ratio is deemed the y axis, and the roughness curve is represented by y=f(x,y). Measurements are conducted using a contact mode utilizing the probe of an atomic force microscope, with a measurement range of 2×2 μm.

$$Ra = \frac{1}{S}\int_0^{Lx}\int_0^{Ly}\left|f(x,y)\right|dxdy$$

There are no particular restrictions on the type of surface roughening treatment used, although preferred techniques include alkali etching treatment, vacuum plasma treatment, or atmospheric corona treatment, or combinations of two or more of these treatments. Examples of specific conditions for each type of treatment are described below.

An alkali etching treatment is a technique in which the polyimide film 1 is immersed in an alkali etching solution, thereby dissolving a thin layer of the polyimide surface, and removing the fragile layer present on the surface of the polyimide film 1. The fragile layer is present on the surface of the polyimide film 1 in varying degrees of thickness, and so following treatment, the surface of the polyimide film 1 displays a certain degree of surface roughness. Examples of suitable alkali etching solutions include solutions containing one, or two or more materials selected from sodium hydroxide, potassium hydroxide, hydrazine hydrate and potassium perchlorate and the like, as well as mixed solutions which also contain ethylenediamine or dimethylamine or the like. The treatment conditions will vary depending on the configuration of the apparatus used, although a concentration of 20 to 80 wt %, a solution temperature from 10 to 80° C., and a treatment time of 30 seconds to 90 minutes are preferred.

In a vacuum plasma treatment, the polyimide film 1 travels through a vacuum vessel and the surface is irradiated with a plasma, thereby removing the fragile layer on the surface of the polyimide film 1. The plasma treatment may use a gas such as argon, oxygen, nitrogen, helium, carbon tetrafluoride, carbon trifluoride or carbon tetrachloride or the like, or a mixture of two or more of these gases. The energy supply source for providing the energy necessary for plasma generation typically utilizes direct current (DC), alternating current (AC), radio frequency (RF), microwaves or an ion beam or the like, and a method for further stabilizing the plasma by applying a magnetic field can also be used. The treatment conditions will vary depending on the configuration of the apparatus used, although in the case of a radio frequency power source, for example, the degree of vacuum within the treatment vessel should preferably be set to a value from $10^{-2}$ to 100 Pa, the applied radio frequency set to a value from 0.05 to 1.0 W/cm$^2$, and the treatment time set to a period from 30 seconds to 20 minutes.

In an atmospheric corona treatment, the polyimide film 1 travels through a normal atmosphere, and a corona discharge is brought in contact with the surface, thereby removing the fragile layer on the surface of the polyimide film 1. The treatment conditions will vary depending on the configuration of the apparatus used, although the current through the blade roll which applies the high frequency, high voltage should preferably be set to a value of 0.5 to 8 A, and the treatment time set to a period from 30 seconds to 20 minutes.

There are no particular restrictions on the thickness of the polyimide film 1, although values from 25 to 125 μm are preferred.

The material for the polyimide film 1 may utilize any polyimide resin typically used for this type of application, and both BPDA type polyimide resins and PMDA type polyimide resins are suitable. Generally, polyimide films using BPDA (biphenyltetracarboxylic acid) as a raw material (such as the commercial product "Upilex" manufactured by Ube Industries) offer superior dimensional stability under heat and moisture absorption, as well as excellent rigidity, and are mainly used for TAB applications, although the bonding strength of these polyimide films with metallic thin films is low. In contrast, polyimide films using PMDA (pyromellitic dianhydride) as a raw material (such as the commercial product "Kapton" manufactured by DuPont-Toray Co., Ltd., or the commercial product "Apical" manufactured by Kaneka Corporation) offer good bonding strength with metallic thin films.

The polyimide film 1 may be a single layer, although a laminated film comprising a plurality of different polyimide resins laminated together is also acceptable. The same effects can be achieved whether the surface of the polyimide film 1 contacting the intermediate layer 2 is a BPDA type polyimide or a PMDA type polyimide.

A second characteristic of the present invention is the fact that the average thickness of the intermediate layer 2 is from 5 to 50% of the Ra value of the polyimide film 1. Average thickness values of the intermediate layer 2 of 30 to 50% are even more preferred. If the thickness falls within this range, then the production costs are not too high, and the improvement in the bonding strength with the metal layer 4 is excellent. If the intermediate layer 2 is too thick, then when the wiring pattern is formed by etching, the quality of the etching deteriorates. If the intermediate layer 2 is too thin, then the film thickness of the intermediate layer 2 begins to lose uniformity, and control of the film thickness becomes problematic, and the bonding strength of the metal layer 4 to the polyimide film 1 also decreases.

Figure 2:
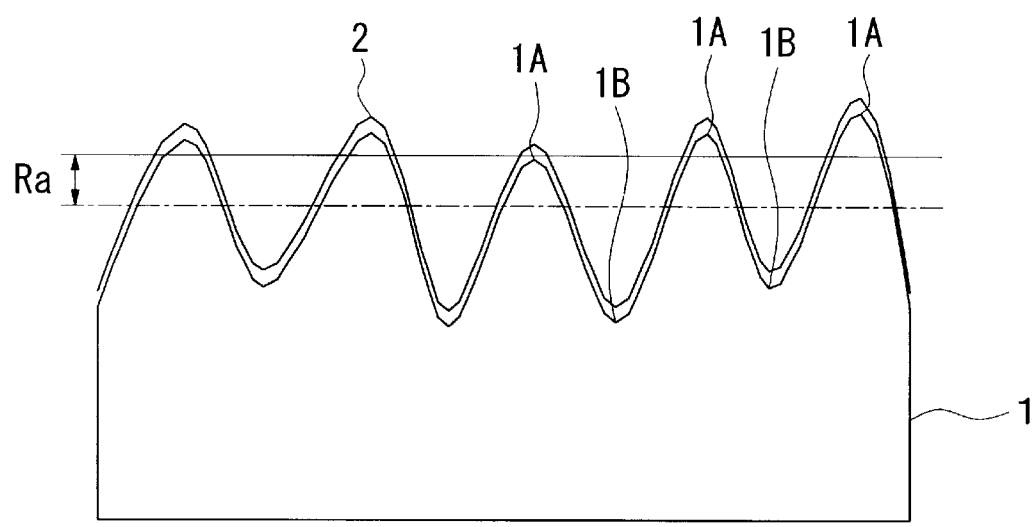
FIG. 2 through FIG. 4 each represent a schematic illustration of an intermediate layer bonded to a polyimide film.
Figure 3:
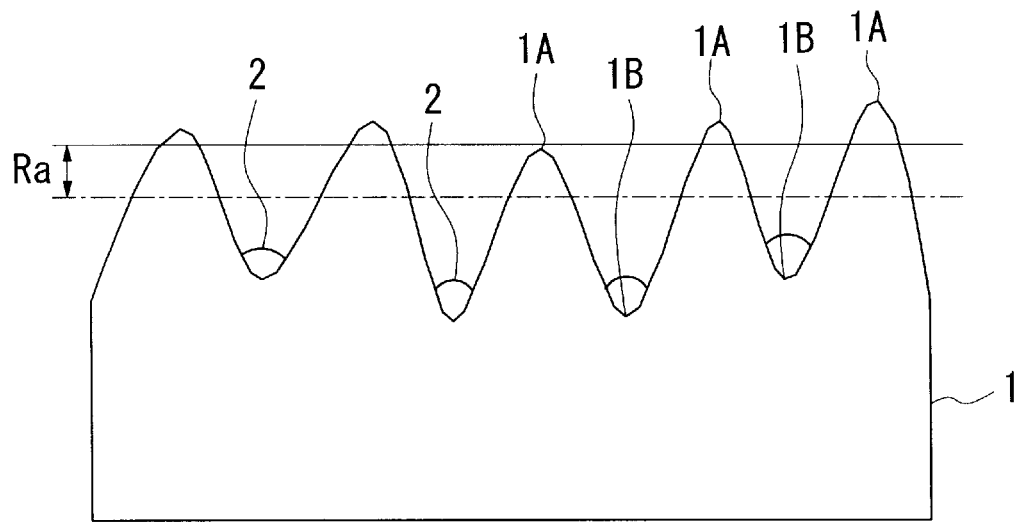
Figure 4:
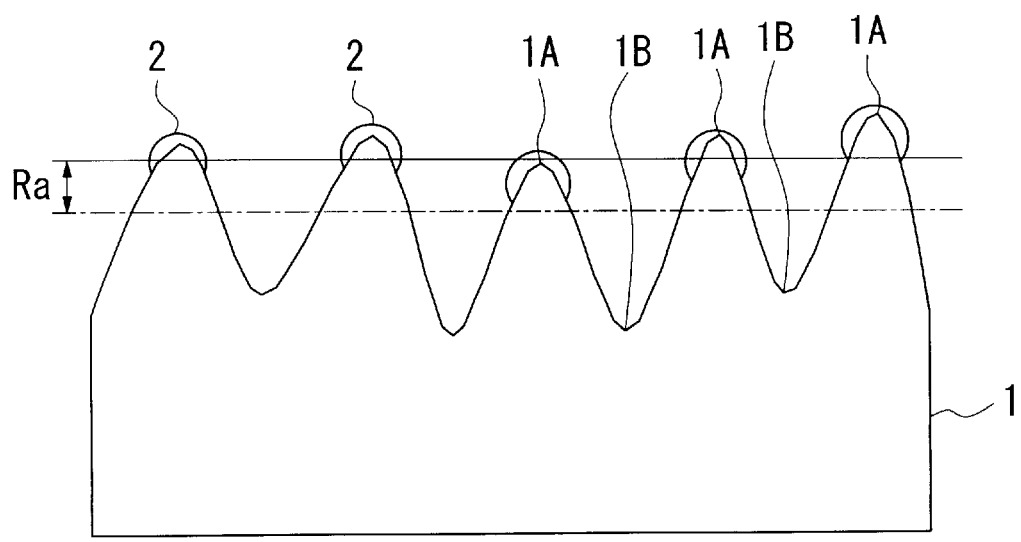

The intermediate layer 2 may be bonded uniformly to the surface of the polyimide film 1, as shown in FIG. 2, although an islands type intermediate layer 2 will also exhibit the effects of the present invention. In other words, the intermediate layer 2 may be concentrated on the convex portions 1A on the surface of the polyimide film 1 as shown in FIG. 4, or concentrated within the concave portions 1B of the polyimide film 1 as shown in FIG. 3. In these types of cases, where the bonding occurs in a non-uniform manner, the average thickness of the intermediate layer 2 refers to the average thickness calculated by dividing the quantity of the intermediate layer 2 by the bonding region surface area of the polyimide film 1.

The material for the intermediate layer 2 may be one, or two or more materials selected from a group consisting of molybdenum, silicon and silicon monoxide, although according to experiments by the inventors, of these materials, molybdenum displays a particularly large bonding strength, and is also superior in terms of maintaining a high bonding strength following a variety of durability tests.

The material for the metal layer 4 may be one, or two or more metals selected from copper, copper alloy, aluminum, aluminum alloy, silver, gold or platinum and the like, although pure copper, or copper alloys containing nickel, zinc or iron and the like are particularly preferred. The thickness of the metal layer 4 may be any thickness sufficient to achieve conductivity. The thickness required to achieve conductivity will vary depending on the material used in the metal layer and the method used to form the layer, although it is though that typically the thickness will be at least 300 angstroms, and at least 1000 angstroms as the film becomes more dense. A thickness of more than 2000 Å is also possible. If the metal layer 4 is too thick, then the cost will become overly expensive, whereas if the layer is too thin, then problems such as burn out are more likely to occur during the plating process.

When forming the metal layer 4, a thin film formation technique such as vacuum deposition, sputtering or ion plating can be used to simply form a film of metal on the polyimide film 1 coated with the intermediate layer 2, or alternatively, a thin film can first be formed, and a metal plating layer can then be deposited on top of this film using either an electroplating method or an electroless plating method.

According to a metallized polyimide film described above and a method of producing such a film, the bonding strength between the polyimide film 1 and the metal layer 4 can be increased, and this superior bonding strength can be maintained following durability tests. Furthermore, a large bonding strength can be achieved regardless of whether the interface contacting the intermediate layer 2 is a BPDA type polyimide or a PMDA type polyimide.

EXAMPLES

Next, the effects of the present invention are substantiated by presenting a series of examples.

Example 1

The commercial product "Upilex S" (thickness 50 $\mu$m) manufactured by Ube Industries was used as a BPDA type polyimide film material, and this film material was subjected to plasma treatment using argon gas, under conditions including a radio frequency of 0.4 W/cm$^2$ and a treatment time of 5 minutes. The Ra value for the film material following this treatment was 2.73 nm.

This surface treated film was then set inside a sputtering apparatus, and an intermediate layer and a metal layer were formed on the plasma treated surface under the conditions described below.

Intermediate layer material: molybdenum

Film formation conditions: argon gas, high frequency output 200 W

Film thickness: 1 nm=36.6% of the Ra value (2.73 nm)

Metal layer material: copper

Film formation conditions: argon gas, high frequency output 200 W

Film thickness: 300 nm

A copper sulfate bath was then used to form a 20 $\mu$m electroplated layer of copper on the metal surface of the metallic thin film, thereby obtaining a metallized polyimide film of the example 1.

Example 2

The commercial product "Kapton II" (thickness 50 $\mu$m) manufactured by DuPont-Toray Co., Ltd. was used as a PMDA type polyimide film material, and by performing treatment in the same manner as the example 1, a metallized polyimide film of the example 2 was obtained. The Ra value following surface treatment was 2.93 nm (and consequently the thickness of the intermediate layer was 34.1% of the Ra value).

Comparative Example 1

The commercial product "Upilex S" (thickness 50 $\mu$m) manufactured by Ube Industries was used as a BPDA type polyimide film material. The Ra value for this untreated film material was 1.38 nm. This film material was set inside a sputtering apparatus, and a metal layer was formed under the conditions described below.

Metal layer material: copper

Film formation conditions: argon gas, high frequency output 200 W

Film thickness: 300 nm

A copper sulfate bath was then used to form a 20 μm electroplated layer of copper on the metal surface of the metallic thin film, thereby obtaining a metallized polyimide film of the comparative example 1.

Comparative Example 2

The commercial product "Kapton II" (thickness 50 μm) manufactured by DuPont-Toray Co., Ltd. was used as a PMDA type polyimide film material. The Ra value for this untreated film material was 1.54 nm. This film material was treated in the same manner as the comparative example 1, thereby obtaining a metallized polyimide film of the comparative example 2.

Comparative Example 3

The commercial product "Upilex S" (thickness 50 μm) manufactured by Ube Industries was used as a BPDA type polyimide film material. The Ra value for this untreated film material was 1.39 nm. This film material was set inside a sputtering apparatus, and an intermediate layer and a metal layer were formed under the conditions described below.

Intermediate layer material: molybdenum

Film formation conditions: argon gas, high frequency output 200 W

Film thickness: 1 nm

Metal layer material: copper

Film formation conditions: argon gas, high frequency output 200 W

Film thickness: 300 nm

A copper sulfate bath was then used to form a 20 μm electroplated layer of copper on the metal surface of the metallic thin film, thereby obtaining a metallized polyimide film of the comparative example 3.

Comparative Example 4

The commercial product "Kapton II" (thickness 50 μm) manufactured by DuPont-Toray Co., Ltd. was used as a PMDA type polyimide film material. This film material was treated in the same manner as the comparative example 3, thereby obtaining a metallized polyimide film of the comparative example 4. The Ra value for the untreated film material was 1.57 nm.

Comparative Experiments

A strip specimen of width 10 mm×length 150 mm was cut from each of the metallized polyimide films of the examples 1, 2 and the comparative examples 1 to 4, and the bonding strength between the film material and the metallic thin film was measured using the method according to IPC-TM-650 (U.S. printed circuit industrial standard test method). In this test method, the polyimide film side of an aforementioned strip specimen is bonded and fixed to the external surface of a 6 inch diameter drum so as to extend around the circumference of the drum, and one end of the metallic film is then pulled away and separated from the polyimide film using a jig moving at 50 mm/minute, and the load required to achieve this separation is measured. The results are shown in Table 1.

Furthermore, a pressure cooker test (PCT) was also performed on each strip specimen, and the same bonding strength test described above was repeated on the metallized polyimide film following PCT, giving an indication of the bonding strength following a durability test. The results are shown in Table 1. The conditions for the PCT included a temperature of 120° C., humidity of 100%, 2 atmospheres, and 48 hours.

TABLE 1

|  | Immediately following film formation | Following PCT test |
|---|---|---|
| Example 1 | 1220 g/cm | 1150 g/cm |
| Example 2 | 1510 g/cm | 1430 g/cm |
| Comparative Example 1 | 182 g/cm | 50 g/cm |
| Comparative Example 2 | 312 g/cm | 150 g/cm |
| Comparative Example 3 | 310 g/cm | 200 g/cm |
| Comparative Example 4 | 1020 g/cm | 450 g/cm |

INDUSTRIAL APPLICABILITY

According to a metallized polyimide film of the present invention, a suitable surface roughening treatment is performed on the surface of the polyimide film, and a film of molybdenum, silicon or silicon monoxide is then formed thereon with a suitable distribution, and consequently the bonding strength of a metal layer can be increased. Accordingly, the present invention is ideally suited to TAB tapes, flexible circuit boards, and flexible wiring boards.

What is claimed is:

1. A metallized polyimide film comprising a polyimide film which has undergone surface roughening treatment to produce a surface Ra value of 2 to 10 nm, an intermediate layer formed from one, or two or more elements selected from a group consisting of molybdenum, silicon and silicon monoxide, which is formed on top of a surface which has undergone said surface roughening treatment, with an average thickness of 5 to 50% of said Ra value, and a conductive metal layer which is formed on top of said intermediate layer.

2. A method of producing a metallized polyimide film comprising a step for performing surface roughening treatment on a surface of a polyimide film to produce a surface Ra value of 2 to 10 nm, a step for forming an intermediate layer from one, or two or more elements selected from a group consisting of molybdenum, silicon and silicon monoxide, which is formed on top of said surface of said polyimide film which has undergone said surface roughening treatment, with an average thickness of 5 to 50% of said Ra value, and a step for forming a conductive metal layer on top of said intermediate layer.

3. A method of producing a metallized polyimide film according to claim 2, wherein said surface roughening treatment is at least one treatment selected from alkali etching treatment, vacuum plasma treatment and atmospheric corona treatment.

* * * * *